United States Patent
Enomoto et al.

(10) Patent No.: US 8,383,016 B2
(45) Date of Patent: Feb. 26, 2013

(54) CONDUCTIVE FINE PARTICLES AND ANISOTROPIC CONDUCTIVE MATERIAL

(75) Inventors: Nana Enomoto, Ibaraki (JP); Kunihiko Akai, Ibaraki (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 13/416,534

(22) Filed: Mar. 9, 2012

(65) Prior Publication Data

US 2012/0228559 A1    Sep. 13, 2012

Related U.S. Application Data

(63) Continuation of application No. 12/851,829, filed on Aug. 6, 2010, now abandoned.

(30) Foreign Application Priority Data

| Aug. 6, 2009 | (JP) | ............................... P2009-183837 |
| Jan. 27, 2010 | (JP) | ............................... P2010-015605 |
| Jun. 22, 2010 | (JP) | ............................... P2010-141796 |

(51) Int. Cl.
 *H01B 1/02* (2006.01)
 *H01B 1/22* (2006.01)
 *B05D 7/00* (2006.01)
 *B32B 5/16* (2006.01)

(52) U.S. Cl. ......... 252/512; 252/513; 427/212; 428/403

(58) Field of Classification Search .................. 252/512, 252/513; 427/212; 428/403
See application file for complete search history.

(56) References Cited

U.S. PATENT DOCUMENTS

| 2007/0059503 A1 | 3/2007 | Park et al. |
| 2007/0190349 A1 | 8/2007 | Ishida |
| 2007/0202335 A1 | 8/2007 | Kubota |

FOREIGN PATENT DOCUMENTS

| CN | 1954393 A | 4/2007 |
| CN | 101006526 A | 7/2007 |
| EP | 1 796 106 A1 | 6/2007 |
| JP | 63-190204 | 8/1988 |
| JP | 2748705 | 2/1998 |
| JP | 10-101962 | 4/1998 |
| JP | 2003-34879 | 2/2003 |
| JP | 2005-36265 | 2/2005 |

(Continued)

OTHER PUBLICATIONS

Office Action issued Feb. 29, 2012 in a counterpart Chinese application 201000248459.5 (no translation available; submitted for certification).

(Continued)

*Primary Examiner* — Mark Kopec
*Assistant Examiner* — Jaison Thomas
(74) *Attorney, Agent, or Firm* — Griffin & Szipl, P.C.

(57) ABSTRACT

Conductive fine particles have core particle surfaces coated with a metal-plated coating film layer containing nickel and phosphorus and a multilayer conductive layer comprising a palladium layer as the outer surface. The phosphorus content in region A of the metal-plated coating film layer, at a distance of no greater than 20% of the thickness of the entire metal-plated coating film layer from the surface of the core particle, is 7-15 wt % of the entire region A. The phosphorus content in region B of the metal-plated coating film layer, at a distance of no greater than 10% of the thickness of the entire metal-plated coating film layer from the surface of the metal-plated coating film layer on the palladium layer side, is 0.1-3 wt % of the entire region B, and the phosphorus content of the entire metal-plated coating film layer is 7 wt % or greater.

12 Claims, 1 Drawing Sheet

FOREIGN PATENT DOCUMENTS

| | | |
|---|---|---|
| JP | 2005-187637 | 7/2005 |
| JP | 2006-28438 | 2/2006 |
| JP | 2006-228475 | 8/2006 |
| JP | 2006-236759 | 9/2006 |
| JP | 2007-305583 | 11/2007 |
| JP | 2007-537570 | 12/2007 |
| JP | 2008-269816 | 11/2008 |
| WO | 03-002955 A1 | 1/2003 |

OTHER PUBLICATIONS

Office Action issued Dec. 6, 2011 in counterpart Japanese application 2010-141796 (no translation available; submitted for certification).

European Search Report issued in a counterpart application No. EP 10 17 2148, completed Nov. 10, 2010 and mailed Nov. 18, 2010.

Office Action issued in counterpart Chinese application 20100248459.5 on Dec. 5, 2012 (no translation available; submitted for certification).

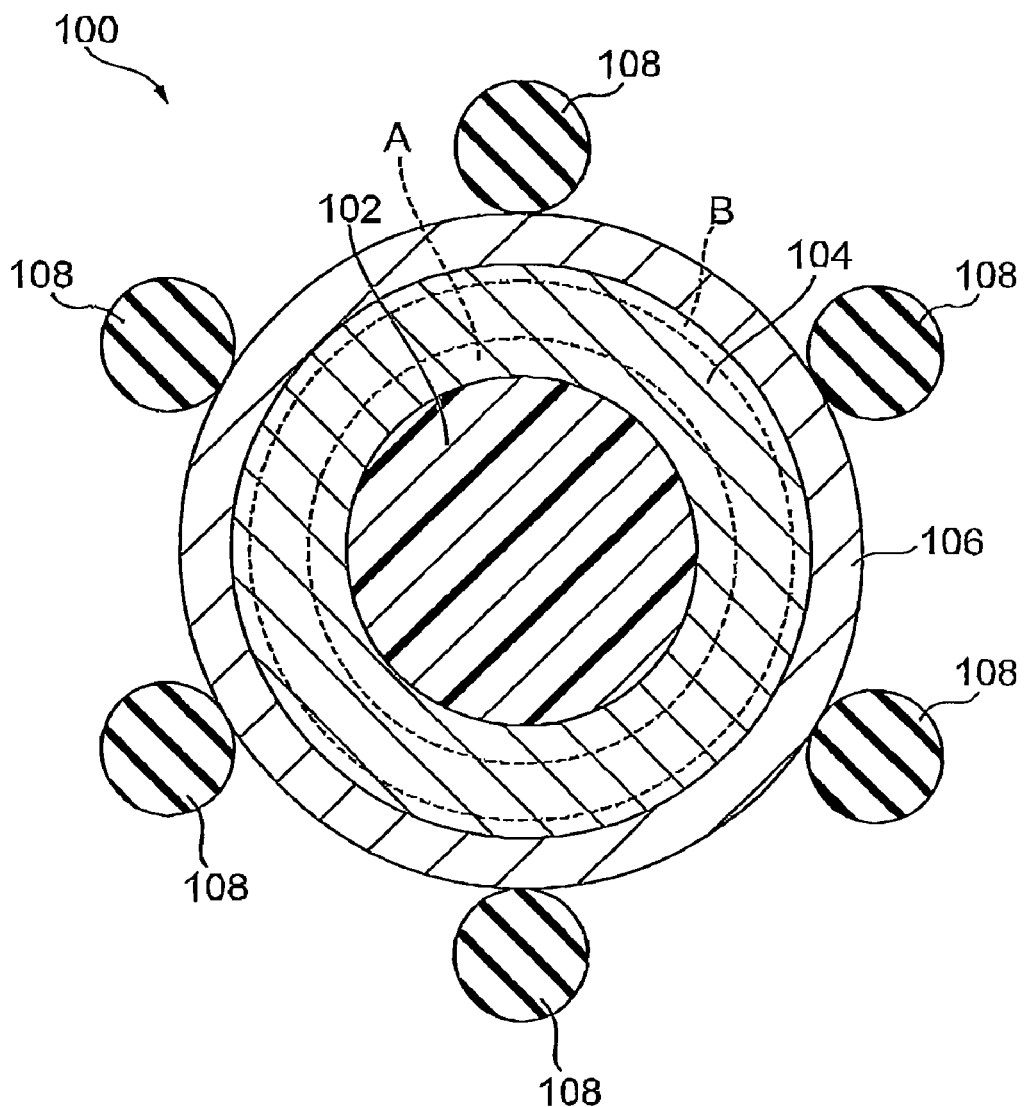

CONDUCTIVE FINE PARTICLES AND ANISOTROPIC CONDUCTIVE MATERIAL

This application is a Continuation of U.S. patent application Ser. No. 12/851,829, filed Aug. 6, 2010, which claims priority from Japanese Patent Application Nos. P2009-183837 filed Aug. 6, 2009, P2010-015605 filed Jan. 27, 2010, and P2010-141796 filed Jun. 22, 2010, the entire disclosures of which are incorporated herein by reference.

BACKGROUND OF THE INVENTION

1. Field of the Invention

The present invention relates to conductive fine particles with a satisfactory monodisperse property, low cost, resistance to migration and excellent conductivity, as well as to a method for producing the conductive fine particles and an anisotropic conductive material using the conductive fine particles.

2. Related Background Art

Conductive fine particles are widely used as anisotropic conductive materials for, anisotropic conductive pastes, anisotropic conductive inks, anisotropic conductive adhesives, anisotropic conductive films, anisotropic conductive sheets and the like, by mixing and kneading with binder resins or adhesives.

Such anisotropic conductive materials are used in between opposing boards or electrode terminals for electrical connection between boards or for electrical connection of small parts such as semiconductor elements to boards in electronic devices such as liquid crystal displays, personal computers and cellular phones, for example.

Conductive fine particles disclosed in the prior art include conductive fine particles wherein a metal-plated coating layer is formed as a conductive film on the surfaces of non-conductive fine particles such as resin fine particles, which have uniform particle sizes and suitable strength, (see Japanese Unexamined Patent Application Publication SHO No. 63-190204, for example).

The conductive fine particles disclosed in Japanese Unexamined Patent Application Publication SHO No. 63-190204 have a nickel-plated coating film formed as a conductive film, but the phosphorus concentration is low during formation of the nickel-plated coating film. With such low-phosphorus concentration nickel-plated coating films (nickel-plated coating layer), a nickel-plated coating film with a crystal structure is formed.

With high-phosphorus concentration nickel-plated coating films, on the other hand, the conductivity is poorer than low-phosphorus concentration nickel-plated coating films, and therefore most of the known nickel-plated coating films are formed with an amorphous structures.

With the rapid advancement of high definition in liquid crystal displays in recent years, the bumps serving as the liquid crystal driving IC circuit electrodes are being designed with increasingly narrow pitches and narrow areas. Since the conductive fine particles must therefore be reduced in size and fewer particles can be captured on the electrodes, it has been necessary to lower the resistance of each conductive fine particle. In Japanese Unexamined Patent Application Publication No. 2006-028438 and Japanese Unexamined Patent Application Publication No. 2005-036265 there are disclosed conductive fine particles with improved conductive performance, having a gold layer as a precious metal formed on the surface of nickel.

Also, Japanese Unexamined Patent Application Publication HEI No. 10-101962 discloses conductive fine particles having shapes protruding through a conductive layer, wherein the protruding sections pierce the oxidized electrode surface to ensure conduction performance and remove the resin between the conductive fine particles and electrode, for an effect of lowering the connection resistance.

With narrowing pitches between circuit electrodes and narrowing areas, short failures occur more often due to bleeding and filling of anisotropic conductive adhesive conductive fine particles between adjacent circuits. Modifications have been proposed to maintain the insulating property between adjacent circuits, in order to avoid these problems.

In Japanese Patent No. 2748705 and International Patent Publication No. WO03/02955 there are described methods wherein macromolecular polymer core particles, that are coated with a gold layer, are further covered with insulating "child particles". Also, International Patent Publication No. WO03/02955 discloses a method wherein the surface of a gold layer coating core particles is treated with a compound having a mercapto, sulfide or disulfide group to form functional groups on the gold layer surface. This allows rigid functional groups to be formed on the gold layer.

SUMMARY OF THE INVENTION

Problem to be Solved by the Invention

A nickel-plated coating film having a low phosphorus concentration during formation of the nickel-plated coating film, such as the conductive fine particles disclosed in Japanese Unexamined Patent Application Publication SHO No. 63-190204, is a ferromagnetic material and therefore has poor dispersibility, and the poor dispersibility of conductive fine particles has been a problem in the steps of mixing and kneading binder resins or adhesives during formation of the anisotropic conductive pastes, anisotropic conductive inks, anisotropic conductive adhesives, anisotropic conductive films and anisotropic conductive sheets mentioned above.

Conductivity is poorer in high-phosphorus concentration nickel-plated coating films than in low-phosphorus concentration nickel-plated coating films. Furthermore, in cases where precious metal layers are to be formed on nickel-plated coating film surfaces by electroless plating, it has been difficult to form dense, uniform precious metal layers on high-phosphorus concentration surfaces. For formation of gold layers, for example, it is common to employ methods of displacement plating or displacement plating followed by reduction plating to form the precious metal layer, but in the case of high-phosphorus concentration nickel-plated coating films, uniform dissolution of nickel is difficult to achieve during the displacement plating reaction, and the precious metal layer that is formed tends to be non-uniform, with the underlying nickel layer being exposed. Discontinuous film formation has also been a problem when the precious metal layer is a palladium layer.

The conductive fine particles with improved conductive performance having a gold layer as a precious metal formed on the surface of nickel, disclosed in Japanese Unexamined Patent Application Publication No. 2006-028438 and Japanese Unexamined Patent Application Publication No. 2005-036265, tend to be costly due to the high price of gold, and the gold layer film thickness must therefore be low. With a thin gold layer, however, satisfactory conductive performance is not achieved and problems such as nickel elution and migration also occur. A metal layer with a gold content of 90 wt % or greater can be formed with the conductive fine particles disclosed in Japanese Unexamined Patent Application Publication No. 2005-036265, but despite satisfactorily reliable conduction, the cost has been impractically high.

Moreover, in methods of covering conductive fine particle surfaces with insulating child particles, as disclosed in Japanese Patent No. 2748705 and International Patent Publication No. WO03/02955, the problem of adhesion between the child particles and conductive fine particles requires that the child particles used be made of acrylic or other resins, but when the metal surface is treated with a compound having a mercapto, sulfide or disulfide group, the presence of a base metal such as nickel or an easily oxidized metal such as copper on the metal, even in small amounts, hinders progress of the reaction between the metal and the compound.

In other words, there is a need for conductive fine particles with lower cost and high insulating treatability as well as excellent conductive performance, and the present inventors have completed this invention as a result of dedicated research on this problem.

It is an object of the invention, in light of the current situation, to provide conductive fine particles with a satisfactory monodisperse property, low cost, resistance to migration and excellent conductivity, as well as a method for producing the conductive particles and an anisotropic conductive material employing the conductive fine particles.

Means for Solving the Problems

As a result of much diligent research, the present inventors have succeeded in obtaining conductive fine particles having a characteristic composition in terms of the phosphorus concentration, indicated below, by carefully adjusting the plating solution composition including the pH, complexing agent and hypophosphorous acid/sodium hydroxide concentration ratio during nickel plating reaction to form a nickel-containing metal-plated coating film layer on the surfaces of core particles. The metal-plated coating film layer on the conductive fine particles comprises 7-15 wt % phosphorus in the metal plating composition in the film thickness region of no greater than 20% from the core particle surface, and comprises 0.1-3 wt % phosphorus in the metal plating composition in the region of no greater than 10% of the metal-plated coating film thickness from the front side of the metal-plated coating film layer facing away from the core particle. It is possible that the excellent monodisperse property of the conductive fine particles is due to the phosphorus content of 7 wt % or greater with respect to the total metal-plated coating film layer and the weak magnetism of the metal-plated coating film layer. Furthermore, presumably because it comprises 0.1-3 wt % phosphorus in the metal plating composition in the region of no greater than 10% of the metal-plated coating film thickness from the front side of the metal-plated coating film layer facing away from the core particles, the palladium plating layer formed on the outer surface is dense and continuous and has a structure that tends to prevent exposure of the underlying nickel, thus allowing conductive fine particles to be obtained that have excellent conductivity and low nickel corrosion or elution. The present inventors have discovered this knowledge and completed the invention thereupon. The invention will now be explained in greater detail.

The conductive fine particles according to the first aspect of the invention have core particle surfaces coated with a metal-plated coating film layer containing nickel and phosphorus and a multilayer conductive layer comprising a palladium layer as the outer surface, and comprise 7-15 wt % phosphorus in the metal plating composition in the film thickness region of no greater than 20% from the core particle surface (region A) and 0.1-3 wt % phosphorus in the metal plating composition in the region of no greater than 10% of the metal-plated coating film thickness from the front side of the metal-plated coating layer facing away from the core particles (region B), wherein the metal-plated coating film layer comprises at least 7 wt % phosphorus. The anisotropic conductive material of the invention has conductive fine particles according to the invention dispersed or situated in a binder resin.

That is, the conductive fine particles according to the first aspect of the invention each comprise a core particle, a metal-plated coating film layer containing nickel and phosphorus formed on the surface of the core particle, and a conductive layer composed of a plurality of layers, formed on the surface of the metal-plated coating film layer facing away from the core particle. Of the plurality of layers of the conductive layer, the layer situated on the surface of the conductive layer facing away from the core particle is a palladium layer. The phosphorus content of the metal-plated coating film layer, in region A at distance from the core particle surface (the distance from the metal-plated coating film layer surface on the core particle side) of no greater than 20% of the thickness of the entire metal-plated coating film layer, is 7-15 wt % with respect to the entire region A. The phosphorus content of the metal-plated coating film layer, in region B at a distance from the metal-plated coating film layer surface on the palladium layer side (conductive layer side) of no greater than 10% of the thickness of the entire metal-plated coating film layer, is 0.1-3 wt % with respect to the entire region B. The phosphorus content is 7 wt % or greater with respect to the entire metal-plated coating film layer.

As shown in FIG. 1, the conductive fine particles 100 according to a mode of the second aspect of the invention each comprise a core particle 102, a metal-plated coating film layer 104 containing nickel and phosphorus formed on the surface of the core particle 102, and a palladium layer 106 formed on the surface of the metal-plated coating film layer 104 facing away from the core particle 102. The phosphorus content of the metal-plated coating film layer 104, in region A at distance from the surface of the metal-plated coating film layer 104 on the core particle 102 side of no greater than 20% of the thickness of the entire metal-plated coating film layer 104, is 7-15 wt % with respect to the entire region A. The phosphorus content of the metal-plated coating film layer 104, in region B at a distance from the surface of the metal-plated coating film layer 104 on the palladium layer 106 side of no greater than 10% of the thickness of the entire metal-plated coating film layer 104, is 0.1-3 wt % with respect to the entire region B. The phosphorus content is 7 wt % or greater with respect to the entire metal-plated coating film layer 104.

According to the invention there are preferably provided insulating fine particles 108 with a particle size of 20-500 nm, on the surface of the palladium layer 106.

Also according to the invention, the palladium layer on the outer surface is preferably dense and continuous with little exposure of the underlying nickel, and preferably no more than 10 particles have 5 or more pinholes per particle, when the palladium layer surface is observed using a SEM (Scanning Electron Microscope), with an observation range of a concentric circle (concentric sphere) of the particle radius, and observation of 100 arbitrarily selected particles at a magnification of 30,000. That is, according to the invention, preferably the palladium layer coats nearly the entire metal-plated coating film layer, and preferably no more than 10 out of 100 particles have 5 or more pinholes per particle, as the number of pinholes formed on the palladium layer surface, within the observation range. In other words, according to the invention preferably no more than 10 conductive fine particles out of 100 conductive fine particles have 5 or more pinholes formed on the palladium layer surface.

Also according to the invention, the thickness of the metal-plated coating film layer containing nickel and phosphorus is preferably 40-150 nm.

At least a part of the palladium layer of the invention is preferably a palladium layer formed by reduction plating.

The palladium layer thickness for the invention is preferably 10-50 nm.

Effect of the Invention

According to the invention, it is possible to provide conductive fine particles with a satisfactory monodisperse property, low cost, resistance to migration and excellent conductivity, by carefully adjusting the plating solution composition including the pH, complexing agent and hypophosphorous acid/sodium hydroxide concentration ratio during nickel plating reaction to form a metal-plated coating film layer with an intentionally modified phosphorus content on the surfaces of core particles, and forming a palladium layer on the outermost layer, as well as to provide an anisotropic conductive material employing the conductive fine particles.

BRIEF DESCRIPTION OF THE DRAWINGS

FIG. 1 is a cross-sectional schematic drawing of conductive fine particles according to an embodiment of the invention.

DESCRIPTION OF THE PREFERRED EMBODIMENTS

The best mode for carrying out the invention will now be explained by examples, with the understanding that the invention is not limited only to the embodiments described herein.

The conductive fine particles of this embodiment each comprise a core particle, a metal-plated coating film layer containing nickel and phosphorus, and a multilayer conductive layer having a palladium layer as the outer surface.

There are no particular restrictions on the core particle, which preferably has a suitable elastic modulus, elastic deformation and recoverability, for example, and may be composed of either an inorganic material or organic material, but it is more preferably a resin fine particle made of a resin, for easier control to a suitable elastic modulus, elastic deformation and recoverability.

There are no particular restrictions on resin fine particles, and examples include polyolefins such as polyethylene, polypropylene, polystyrene, polyvinyl chloride, polyvinylidene chloride, polytetrafluoroethylene, polyisobutylene and polybutadiene; acrylic resins such as polymethyl methacrylate and polymethyl acrylate; divinylbenzene polymerization resins; divinylbenzene-based copolymerization resins such as divinylbenzene-styrene copolymer, divinylbenzene-acrylic acid ester copolymer and divinylbenzene-methacrylic acid ester copolymer; polyalkylene terephthalates, polysulfones, polycarbonates, polyamides, phenol-formaldehyde resins, melamine-formaldehyde resins, benzoguanamine-formaldehyde resins, urea-formaldehyde resins and the like. These resin fine particles may be used alone or in combinations of two or more.

There are also no particular restrictions on the mean particle size of the core particles, but it is preferably no smaller than 1 μm and no larger than 20 μm. A size of smaller than 1 μm will, for example, tend to result in aggregation during electroless plating and prevent formation of simple particles, while a size of greater than 20 μm may exceed the range for use as an anisotropic conductive material between board electrodes. A more preferred upper limit for the mean particle size of the core particles is 10 μm, with 5 μm being particularly preferred.

The metal-plated coating film layer containing nickel and phosphorus comprises 7-15 wt % phosphorus in the metal plating composition in the film thickness region of no greater than 20% from the core particle surface (region A). The phosphorus content in region A is more preferably 7-14 wt %, and most preferably 7-13 wt %. The metal-plated coating film layer also comprises 0.1-3 wt % phosphorus in the metal plating composition in the region of no greater than 10% of the metal-plated coating film thickness from the front side of the metal-plated coating film layer facing away from the core particle (region B). The phosphorus content in region B is more preferably 0.1-2.5 wt %, and most preferably 0.1-2 wt %. The entire metal-plated coating film layer comprises at least 7 wt % phosphorus. If the phosphorus content is 7-15 wt % in the metal plating composition in a film thickness region of no greater than 20% from the surface in contact with the core particle surface and the entire metal-plated coating film layer contains at least 7 wt % phosphorus, as according to this embodiment, magnetism of the metal-plated coating film layer may be suppressed and a satisfactory monodisperse property can be obtained for the conductive fine particles. Furthermore, if the metal plating composition contains 0.1-3 wt % phosphorus in the region of no greater than 10% of the metal-plated coating film thickness from the front side of the metal-plated coating film layer, a uniform palladium layer can be formed and a dense and continuous palladium layer can be obtained having a structure that tends to prevent exposure of the underlying nickel. This can yield conductive fine particles with excellent conductivity. In order to ensure satisfactory conductivity, the phosphorus content with respect to the entire metal-plated coating film layer is preferably no greater than 15 wt %. If it exceeds 15 wt %, the conductivity of the obtained conductive fine particles will tend to be reduced.

The preferred lower limit for the phosphorus content in region A is 7 wt % and the preferred upper limit is 15 wt %. At less than 7 wt %, the nickel-containing metal-plated coating film layer (nickel plating layer) will tend to be hard and prone to cracking, while magnetism-induced aggregation may occur and the dispersibility may be impaired. At greater than 15 wt %, the nickel plating layer will tend to be too soft and the adhesiveness between the core particle and the conductive layer may be impaired.

The preferred lower limit for the phosphorus content in region B is 0.1 wt % and the preferred upper limit is 3 wt %. At greater than 3 wt %, the crystal structure of the nickel-containing metal-plated coating film layer will tend to be coarse and it may not be possible to form a dense, continuous palladium layer.

The film thickness region which comprises 0.1-3 wt % phosphorus in the metal plating composition is the film thickness region of no greater than 10% from the front side of the metal-plated coating film layer. A metal plating comprising 0.1-3 wt % phosphorus is a ferromagnetic material, and therefore if the film thickness region of greater than 10% from the front side of the metal-plated coating film layer is a ferromagnetic material, aggregation of the conductive fine particles may occur and the dispersibility may be poor, due to the magnetism of the metal-plated coating film layer.

For this embodiment, the conductive fine particle preferably comprises insulating fine particles situated on the palladium layer surface and having a particle size of 20-500 nm.

The insulating fine particles are preferably composed of an inorganic oxide. If the insulating particles are composed of an organic compound, the insulating particles may deform during the process of producing the anisotropic conductive material, tending to result in changes in the obtained anisotropic conductive property. However, an organic compound can be used as the insulating fine particles if care is taken during the production process. The insulating resin layer may be formed on the surfaces of conductive fine particles instead of insulating fine particles. Such particles can be produced by the methods described in Japanese Unexamined Patent Application Publication No. 2008-269816, Japanese Unexamined Patent Application Publication No. 2006-236759 or Japanese Unexamined Patent Application Publication No. 2005-187637, for example.

Examples of inorganic oxides as materials for the insulating fine particles include the oxides of silicon, aluminum, zirconium, titanium, niobium, zinc, tin, cerium and magnesium. Such inorganic oxides may be used alone or in combinations of two or more. Most preferred as an inorganic oxide, among oxides containing the aforementioned elements, is water-dispersed colloidal silica ($SiO_2$) which has excellent insulating property and a controlled particle size.

The particle size of the inorganic oxide fine particles is preferably smaller than that of the resin fine particles (core particles). Specifically, it is preferably 20-500 nm, more preferably 20-400 nm, even more preferably 30-300 nm and most preferably 40-200 nm. The particle size of the inorganic oxide fine particles is measured by a conversion of a specific surface area using a BET method, or by small angle x-ray scattering. If the particle size is less than 20 nm, the inorganic oxide fine particles adsorbed onto the palladium layer may fail to function as an insulating film, tending to result in shorting at sections between electrodes. If the particle size is greater than 500 nm, on the other hand, sufficient conductivity may not be achieved between electrodes.

The palladium layer on the outer surface of the conductive fine particles of this embodiment is preferably dense and continuous with little exposure of the underlying nickel, and preferably no more than 10 particles have 5 or more pinholes per particle, when the palladium layer surface is observed using a SEM, with an observation range in a concentric circle of the particle radius, and observation of 100 arbitrarily selected particles at a magnification of 30,000. If more than 10 out of 100 particles have 5 or more pinholes per particle in the observation range, migration will tend to occur when an anisotropic conductive paste, anisotropic conductive ink, anisotropic conductive adhesive, anisotropic conductive film, anisotropic conductive sheet or the like has been formed. Therefore, preferably no more than 10, more preferably no more than 7, even more preferably no more than 5 and most preferably no more than 3 out of 100 particles have 5 or more pinholes.

A "pinhole" according to the invention is a hole with a diameter of 20-150 nm, observed on the surface of the palladium layer of a conductive fine particle. According to the invention, a hole larger than 150 nm is a "dimple" caused by peeling of the plating that occurs during the plating and disintegrating steps. When the shape of the hole is not circular, the diameter of the hole is the diameter of a circle circumscribed around it.

The lower limit of the thickness of the metal-plated coating film layer containing nickel and phosphorus on the conductive fine particles of this embodiment is preferably 40 nm and the upper limit is preferably 150 nm. If it is less than 40 nm, the desired conductivity may not be obtained, and if it is greater than 150 nm the adhesiveness between the conductive layer and core particle may be reduced, leading to easier peeling. This can also have an effect on the particle sizes of the conductive fine particles. The thickness of the metal-plated coating film layer is preferably 40 nm-150 nm, more preferably 45-140 nm and most preferably 50-110 nm, which will ensure conductivity and will also not affect the particle size.

Since the palladium layer is ductile, it is resistant to metal cracking after compression of the conductive fine particles, and resistant to the migration that is caused by metal cracking. Palladium also has excellent conductivity similar to gold and platinum, but palladium is cheaper compared to the same volume of these precious metals, and therefore more practical. For these reasons, the outermost layer is preferably a palladium layer. Using a palladium layer can prevent oxidation of the conductive layer, lower the connection resistance and stabilize the surface.

The method of forming the palladium layer on the outer surface of the conductive fine particles of this embodiment may be a known method such as electroless plating, displacement plating, electroplating, reduction plating or sputtering. It can be formed by displacement plating, but this does not allow easy formation of a dense, continuous palladium layer. The conductive fine particles therefore preferably have at least a part of a palladium layer formed by reduction plating. This can easily produce a dense, continuous palladium layer and improve the coating ratio of the palladium layer while also improving the conductivity. If the reduction plating of at least a part of the palladium layer is carried out, it can also be combined with displacement plating to form the palladium layer. For example, after the palladium layer has been formed by displacement plating, by dipping the metal-plated coating film layer (nickel plating layer)-formed particles in a displacement plating solution, the particles may be subsequently dipped in a reduction plating solution to increase the thickness of the palladium layer formed by displacement plating. The palladium layer formed by displacement plating and reduction plating is continuous with no boundary in the thickness direction. The process is preferably even further simplified by using a plating solution that allows displacement plating reaction and reduction plating reaction to proceed simultaneously.

The palladium layer may also be an alloy of palladium and phosphorus, for example. When the palladium is an alloy, the palladium content of the alloy is preferably at least 70 wt % and more preferably at least 90 wt % and less than 100 wt %, from the viewpoint of conductivity.

The thickness of the palladium layer is preferably 10 nm-50 nm, more preferably 10-40 nm and most preferably 10-30 nm. If the thickness of the palladium layer is less than 10 nm, it may be difficult to prevent oxidation of the conductive layer, the connection resistance value may be increased, and sufficient conductivity may not be achieved. If the palladium thickness is greater than 50 nm, on the other hand, the elasticity of the overall conductive fine particles will tend to be reduced. A thicker palladium layer increases cost and is not economically advantageous.

For production of the conductive fine particles of this embodiment, the plating may be carried out first by forming a nickel plating layer containing 7-15 wt % phosphorus in the metal plating composition on the surface of core particles, and then forming thereover a nickel plating layer containing 0.1-3 wt % phosphorus in the metal plating composition. The method of forming the nickel plating layer containing 7-15 wt % phosphorus and the nickel plating layer containing 0.1-3 wt % phosphorus may be, for example, a method of controlling the pH of the plating reaction or a method of controlling the phosphorus concentration of the nickel plating solution. A method of controlling the pH of the plating reaction is preferred for superior reaction control.

Each step will now be explained in detail. The method for producing the conductive fine particles of this embodiment preferably includes a step of adding a catalyst to the surfaces of the core particles. The method of adding the catalyst may involve pretreatment such as preparing the surfaces of the core particles to ensure dispersibility, plated catalyst attachment and plating attachment. The pretreatment method may be, for example, alkali or acidic degreasing, hydrophilicizing treatment with a surfactant, or reforming treatment with addition of functional groups to the core particle surfaces. After the pretreatment, a catalyzing step is carried out to add the catalyst to the core particle surfaces, as nuclei for electroless plating reduction reaction. Examples of most often used electroless nickel plating catalysts include palladium, gold and platinum. As specific example of a method of adding the catalyst is one wherein the pretreated core particles are loaded into a palladium catalyst solution that has been ionized or converted to a stable complex, and dispersing or stirring to add the catalyst such as stabilized palladium to the core particle surfaces. This is then reduced to add palladium metal on the core particle surfaces. Another common method for catalyst addition is one wherein the core particles that have been acid-neutralized after alkali degreasing are then dipped in a tin dichloride solution for sensitizing, and then subsequently dipped in a palladium dichloride solution for activating.

Reduction plating allows the plating thickness of the nickel layer to be easily controlled. For example, since the post-deposition plating thickness can be easily calculated from the nickel ion concentration in the plating solution that is used, it is possible to avoid the use of excess nickel or reagent and to lower the cost. The reduction plating method may be, for example, a method of dispersing the catalyst-added core particles in a prepared bath for reduction nickel plating, or a dropping method in which a metering pump is used to drop the reduction plating solution into a bath in which the catalyst-added core particles have been dispersed. A dropping method allows precise control of the amount of reduction plating dropped based on the dropping rate and dropping time, and is therefore most preferred for easier control of the nickel plating layer thickness to be formed on the core particles. When plating is performed on fine particles according to the invention, the plating bath load (the value of the particle surface area divided by the plating solution volume) is extremely high, and in the case of reduction plating, excess reduction reaction takes place and abnormal deposition (plating flaws) tends to occur. A dropping method is preferred because an extremely low Ni ion concentration can be maintained in the plating bath, and a smooth plated surface with no plating flaws can be obtained.

If the nickel layer is a reduction plated nickel layer, a dense and uniform nickel layer can be formed on the resin fine particles, thus allowing provision of conductive particles with low exposure of the resin fine particle surfaces. Even if the core particles are composed of a non-conductive material, electroless plating can form a nickel layer that covers nearly all of the core particles. The nickel layer is preferably a reduction plated nickel layer. This will improve the coating ratio of the nickel layer on the core particles, and will further improve the conductivity of the conductive fine particles.

The method for producing conductive fine particles according to this embodiment can yield conductive fine particles with a modified phosphorus concentration, by using an electroless nickel plating solution, for example, and carefully adjusting the plating solution composition including the pH, complexing agent and hypophosphorous acid/sodium hydroxide concentration ratio during nickel plating reaction on the surfaces of core particles. A phosphorus concentration of 7-15 wt % can be obtained in the electroless nickel plating solution by using at least one compound selected from the group consisting of citric acid, malic acid, succinic acid, propionic acid, lactic acid and salts thereof as the complexing agent, and adjusting the pH to no higher than 5.5. It is also known that the hypophosphorous acid/sodium hydroxide concentration ratio can be adjusted to modify the phosphorus concentration.

The phosphorus concentration may be adjusted in the manner described above for the method for producing conductive fine particles having a 0.1-3 wt % phosphorus-containing nickel plating layer, but a 0.1-3 wt % phosphorus-containing nickel plating layer can also be formed, for example, by adjusting the pH to 5.5 or higher during the nickel plating reaction. The nickel layer contains phosphorus according to the invention, but it may also contain other components so long as the effect of the invention is not impaired.

An anisotropic conductive material can be produced by dispersing or situating conductive fine particles of this embodiment in a binder resin. Such an anisotropic conductive material is also one mode of the invention.

Specific examples of anisotropic conductive materials according to this embodiment include anisotropic conductive pastes, anisotropic conductive inks, anisotropic conductive adhesive layers, anisotropic conductive films and anisotropic conductive sheets.

The resin binder is not particularly restricted, and insulating resins may be used, including vinyl-based resins such as vinyl acetate-based resins, vinyl chloride-based resins, acrylic-based resins and styrene-based resins; thermoplastic resins such as polyolefin-based resins, ethylene-vinyl acetate copolymers and polyamide-based resins; curable resins comprising epoxy-based resins, urethane-based resins, polyimide-based resins, unsaturated polyester-based resins and their curing agents; thermoplastic block copolymers such as styrene-butadiene-styrene block copolymer, styrene-isoprene-styrene block copolymer and hydrogenated forms of the foregoing; and elastomers (rubbers) such as styrene-butadiene copolymer rubber, chloroprene rubber and acrylonitrile-styrene block copolymer rubber. These resins may be used alone or in combinations of two or more. The aforementioned curable resins may be any curable type, such as ordinary temperature-curing, thermosetting, photocuring or moisture curing types.

The anisotropic conductive material of this embodiment may also contain various additives, in addition to the conductive fine particles of this embodiment and the aforementioned resin binder, such as extenders, softening agents (plasticizers), adhesion improvers, antioxidants (age inhibitors), heat stabilizers, photo stabilizers, ultraviolet absorbers, coloring agents, flame retardants, organic solvents and the like, as necessary and in ranges that do not interfere with the object of the invention.

The method for producing an anisotropic conductive material according to this embodiment is not particularly restricted and may be, for example, a method of adding the conductive fine particles of this embodiment into an insulating resin binder and uniformly mixing for dispersion to form an anisotropic conductive paste, anisotropic conductive ink or anisotropic conductive adhesive, for example, or a method of adding the conductive fine particles of this embodiment into an insulating resin binder and uniformly dissolving (dispersing) them, or heating to dissolution, coating it onto the release-treated surface of a release agent such as a releasable sheet or releasable film to a prescribed film thickness and drying and cooling it if necessary, to obtain an anisotropic conductive film or anisotropic conductive sheet, with a suitable production method being selected according to the type of anisotropic conductive material that is to be produced. The insulating resin binder and the conductive fine particles of this embodiment may also be used separately without mixing, to form the anisotropic conductive material.

The above detailed explanation of a preferred embodiment of the conductive fine particles of the invention is not intended to restrict the scope of the invention to this particular embodiment.

EXAMPLES

Mother Particle 1

A 3 g portion of crosslinked polystyrene particles (resin fine particles) having a mean particle size of 3.8 µm were degreased with a sodium hydroxide aqueous solution and neutralized with acid for surface modification. After loading surface-modified resin fine particles in 100 mL of the alkali palladium catalyst ATOTECH NEOGANTH 834 (trade name of Atotech Japan) and stirring at 35° C. for 10 minutes, it was filtered by a membrane filter having a pore diameter of 3 µm (Millipore). The particles were rinsed with 200 ml of distilled water and filtered in the same manner as before. An "alkali palladium catalyst" is generally a catalyst for forming a plating layer such as a palladium layer on resin fine particle surfaces, and not the actual palladium layer of the invention.

The rinsed polystyrene particles were then added to a 3 g/L sodium hypophosphite aqueous solution prepared to 70° C., pH 6.0, to obtain surface-activated resin fine particles.

After loading 1000 ml of water, 20 g/L of sodium malate and the resin fine particles surface-activated with the palladium catalyst in a 2000 ml glass beaker and subjecting the mixture to ultrasonic dispersion, the pH was adjusted to below 5.5 while stirring (600 rpm) with a fluorine stirring blade, and heating was carried out to 80° C. The initial thin-film plating solution comprising SEK670 (product name of Japan Kanigen Co., Ltd.) as an electroless nickel plating solution mixed in a proportion of (SEK670-0)/(SEK670-1) =1.8, was added at 7 ml/min using a metering pump, and reduction reaction began after about 30 seconds, generating air bubbles in the bath and causing the entire bath to change color from gray to black. Immediately upon completion of the initial thin-film formation, coat-thickening plating solution "a", comprising a mixture of nickel sulfate: 224 g/L and sodium malate: 305 g/L, and coat-thickening plating solution "b" comprising a mixture of sodium hypophosphite: 534 g/L and sodium hydroxide: 34 g/L, were simultaneously added as two solutions at 13 ml/min. After stirring until cessation of air bubble generation, the color of the entire bath changed from black to gray. The plating bath had a final pH of 3.5. It was then filtered to obtain primary nickel-plated particles 1. The electroless nickel plating solution SEK670 contains primarily sodium hypophosphite as the reducing agent.

Next, after ultrasonic dispersion of the primary nickel-plated particles 1 in 1000 ml of water and 20 g/L of sodium tartrate, in a 2000 ml beaker, the pH was adjusted to above 6.0 while stirring (600 rpm) with a fluorine stirring blade, and heating was carried out to 80° C. A metering pump was used to add coat-thickening plating solution "c" comprising a mixture of nickel sulfate: 224 g/L and sodium tartrate: 20 g/L and coat-thickening plating solution "d" comprising a mixture of sodium hypophosphite: 226 g/L and sodium hydroxide: 85 g/L at 15 ml/min, and reduction reaction began immediately after the dropwise addition, generating air bubbles in the bath. Upon completion of the plating, the pH was 6.0 and the entire bath was gray. After filtering, rinsing was carried out 3 times with distilled water to obtain secondary nickel-plated particles 1. The pH was constantly measured and particles periodically sampled during the electroless nickel plating.

PALET (product name, Kojima Chemicals Co., Ltd.) was used as an electroless palladium plating solution for bath preparation, and heating was carried out to 70° C. while stirring with a fluorine stirring blade. The secondary nickel-plated particles 1 were loaded therein and plated for 5 minutes, and then subjected to filtration and rinsing 3 times. After drying for 7 hours with a 40° C. vacuum dryer they were disintegrated the aggregates, to obtain mother particles 1.

(Mother Particles 2)

Pretreatment was carried out in the same manner as the method for preparing the mother particles 1, the temperature during electroless nickel plating was 70° C., coat-thickening plating solutions "a" and "b" were used, and the pH was 4.0 to reduce the phosphorus concentration in region A below that of the mother particles 1, to obtain primary nickel-plated particles 2. Next, secondary nickel-plated particles 2 were obtained in the same manner as the method for preparing the mother particles 1 except for using coat-thickening plating solutions "c" and "d" and adjusting the pH to 6.2 in the bath upon completion of plating to lower the phosphorus concentration in region B below that of the mother particles 1, and then palladium plating was carried out in the same manner to obtain mother particles 2.

(Mother Particles 3)

Pretreatment was carried out in the same manner as the method for preparing the mother particles 1, the dropping time for coat-thickening plating solutions "a" and "b" during the electroless nickel plating was shortened, and the pH was 4.3, to obtain primary nickel-plated particles 3. Next, secondary nickel-plated particles 3 were obtained in the same manner as the method for preparing the mother particles 1 except that the dropping time for coat-thickening plating solutions "c" and "d" was shortened and the pH was adjusted to 5.8, and then palladium plating was carried out in the same manner as the method for preparing the mother particles 1 to obtain mother particles 3.

(Mother Particles 4)

Resin fine particles surface-activated with an alkali palladium catalyst were obtained in the same manner as the method of preparing the mother particles 1. After loading 1000 ml of water, 20 g/L of sodium malate and the resin fine particles surface-activated with a palladium catalyst in a 2000 ml glass beaker and subjecting the mixture to ultrasonic dispersion, the pH was adjusted to below 5.5 while stirring (600 rpm) with a fluorine stirring blade, and heating was carried out to 80° C. The initial thin-film plating solution comprising SEK670 (product name of Japan Kanigen Co., Ltd.) as an electroless nickel plating solution mixed in a proportion of (SEK670-0)/(SEK670-1)=1.8, was added at 7 ml/min using a metering pump, and reduction reaction began after about 30 seconds, generating air bubbles in the bath and causing the entire bath to change color from gray to black. Immediately upon completion of the initial thin-film formation, coat-thickening plating solution "e" comprising a mixture in a proportion of (SEK670-1)/distilled water=1.0 and coat-thickening plating solution "f" comprising a mixture in a proportion of (SEK670-2)/(SEK670-3)=1.0 were simultaneously added as two solutions at 13 ml/min. After stirring until cessation of air bubble generation, the color of the entire bath changed from black to gray. The plating bath had a final pH of 4.5. It was then filtered to obtain primary nickel-plated particles 4.

Next, after ultrasonic dispersion of the primary nickel-plated particles 4 in 1000 ml of water and 20 g/L of sodium tartrate, in a 2000 ml beaker, the pH was adjusted to above 5.5 while stirring (600 rpm) with a fluorine stirring blade, and heating was carried out to 80° C. A metering pump was used for addition of TOP NICORON LPH-S (product name of Okuno Chemical Industries Co., Ltd.) at 18 ml/min, and reduction reaction began immediately after the dropwise addition, generating air bubbles in the bath. Upon completion of the plating, the pH was 6.3 and the entire bath was gray. After filtering, rinsing was carried out 3 times with distilled water to obtain secondary nickel-plated particles 4. The electroless nickel plating solution TOP NICORON LPH-S contains primarily sodium hypophosphite as the reducing agent.

MELPLATE Pal-6700 (trade name of Meltex, Inc.) was used as an electroless palladium plating solution for bath preparation, and heating was carried out to 70° C. while stirring with a fluorine stirring blade. The secondary nickel-plated particles 4 were loaded therein and plated for 5 minutes, and then subjected to filtration and rinsing 3 times. After drying for 7 hours with a 40° C. vacuum dryer they were disintegrated the aggregates, to obtain mother particles 4.

(Mother Particles 5)

Pretreatment was carried out in the same manner as the method for preparing the mother particles 1, coat-thickening plating solutions "e" and "f" were used for electroless nickel plating of the mother particles 4, and the pH was adjusted to 5.3 to reduce the phosphorus concentration in region A below that of the mother particles 4, to obtain primary nickel-plated particles 5. Next, secondary nickel-plated particles 5 were obtained in the same manner as the method for preparing the mother particles 1 except that the coat-thickening plating solutions "c" and "d" used for preparation of the mother particles 1 were added dropwise and the pH was adjusted to 6.8, and then palladium plating was carried out in the same manner as the method for preparing the mother particles 1 to obtain mother particles 5.

(Mother Particles 6)

Secondary nickel-plated particles 6 were obtained in the same manner as the method for preparing the mother particles 1, except that dropwise addition of the coat-thickening plating solutions "c" and "d" of the mother particles 1 was omitted. Palladium plating was then carried out in the same manner as the method for preparing the mother particles 1 to obtain mother particles 6.

(Mother Particles 7)

Secondary nickel-plated particles 7 were obtained in the same manner as the mother particles 1, except that coat-thickening plating solution "e" comprising a mixture in a proportion of (SEK670-1)/distilled water=1.0 and coat-thickening plating solution "f" comprising a mixture in a proportion of (SEK670-2)/(SEK670-3)=1.0 were added dropwise using a metering pump at 20 ml/min, instead of the coat-thickening plating solutions "c" and "d" of the mother particles 1. Next, palladium plating was carried out using the electroless palladium plating solution MELPLATE Pal-6700 (trade name of Meltex, Inc.), in the same manner as the method for preparing the mother particles 4, to obtain mother particles 7.

(Mother Particles 8)

After obtaining resin fine particles surface-activated with an alkali palladium catalyst in the same manner as the method for preparing the mother particles 1, 1000 ml of water, 20 g/L of sodium tartrate and the resin fine particles surface-activated with a palladium catalyst were loaded in a 2000 ml glass beaker, the mixture was subjected to ultrasonic dispersion, and then the pH was adjusted to above 5.5 while stirring (600 rpm) with a fluorine stirring blade, and heating was carried out to 80° C. Coat-thickening plating solution "c" comprising a mixture of nickel sulfate: 224 g/L and sodium tartrate: 20 g/L and coat-thickening plating solution "d" comprising a mixture of sodium hypophosphite: 226 g/L and sodium hydroxide: 85 g/L were dropped at 6 ml/min, and reduction reaction began 30 seconds after the dropwise addition, generating air bubbles in the bath and changing the color of the entire bath from gray to black. After then adjusting the pH to 6.3 with ammonia and sulfuric acid, the dropping rate was adjusted to 20 ml/min and the two solutions were simultaneously added. After stirring until cessation of air bubble generation, the color of the entire bath changed from black to gray. The plating bath had a final pH of 6.1. Filtration and rinsing were then carried out 3 times to obtain secondary nickel-plated particles 8. Palladium plating was then carried out in the same manner as the method for preparing the mother particles 1 to obtain mother particles 8.

(Conductive Particles 1)

<Insulating Covering Treatment>

The surfaces of the mother particles 1 were subjected to insulating covering treatment for adsorption of silica fine particles as insulating particles, by the method disclosed in Japanese Unexamined Patent Application Publication No. 2008-120990. For convenience of explanation in the Examples, mother particles with insulating particles on the surface will be referred to as "conductive particles" as distinct from mother particles without insulating particles on the surface, and the mother particles 1-5 mentioned above and the conductive particles 1-5 mentioned below all correspond to conductive fine particles according to the invention.

An 8 mmol portion of mercaptoacetic acid was dissolved in 200 ml of methanol to prepare a reaction mixture.

A 1 g portion of the mother particles 1 was then added to the reaction mixture, and the mixture was stirred with a three-one motor for 2 hours at room temperature (25° C.). After rinsing with methanol, a membrane filter having a pore diameter of 3 μm (Millipore) was used to filter the mother particles 1 to obtain primary treated particles 1 having carboxyl groups on the surfaces.

Next, a 30% polyethyleneimine aqueous solution with a molecular weight of 70,000 (Wako Pure Chemical Industries, Ltd.) was diluted with ultrapure water to obtain a 0.3 wt % polyethyleneimine aqueous solution. A 1 g portion of the primary treated particles 1 with carboxyl groups was added to the 0.3 wt % polyethyleneimine aqueous solution, and the mixture was stirred at room temperature for 15 minutes.

After then filtering the primary treated particles 1 with a membrane filter having a pore diameter of 3 μm (Millipore), 200 g of ultrapure water was added and the mixture was stirred at room temperature for 5 minutes. The primary treated particles 1 were further filtered with a membrane filter having a pore diameter of 3 μm (Millipore), and rinsed twice with 200 g of ultrapure water on the membrane filter to remove the polyethyleneimine that had not been adsorbed onto the primary treated particles 1.

Next, a colloidal silica dispersion (20% weight concentration, trade name: QUARTRON PL-10 by Fuso Chemical Co., Ltd., mean particle size: 100 nm) as insulating particles was diluted with ultrapure water to obtain a 0.1 wt % silica dispersion solution. The primary treated particles 1 that had been treated with the polyethyleneimine were placed in the 0.1 wt % silica dispersion solution and the mixture was stirred at room temperature for 15 minutes.

After then filtering the primary treated particles 1 with a membrane filter having a pore diameter of 3 μm (Millipore), 200 g of ultrapure water was added and the mixture was stirred at room temperature for 5 minutes. The mother particles 1 were further filtered with a membrane filter having a pore diameter of 3 μm (Millipore), and rinsed twice with 200 g of ultrapure water on the membrane filter to remove the silica that had not been adsorbed onto the mother particles 1. Drying was then carried out at 80° C. for 30 minutes and followed by heated drying at 120° C. for 1 hour, to prepare conductive particles 1 having silica (child particles) adsorbed on the surfaces of the mother particles 1.

(Conductive Particles 2)

Conductive particles 2 were prepared by the same method as that for preparing the conductive particles 1, except that the mother particles 2 were used instead of the mother particles 1.

(Conductive Particles 3)

Conductive particles 3 were prepared by the same method as that for preparing the conductive particles 1, except that the mother particles 3 were used instead of the mother particles 1.

(Conductive Particles 4)

Conductive particles 4 were prepared by the same method as that for preparing the conductive particles 1, except that the mother particles 4 were used instead of the mother particles 1.

(Conductive Particles 5)

Conductive particles 5 were prepared by the same method as that for preparing the conductive particles 1, except that the mother particles 5 were used instead of the mother particles 1.

(Conductive Particles 6)

Conductive particles 6 were prepared by the same method as that for preparing the conductive particles 1, except that the mother particles 6 were used instead of the mother particles 1.

(Conductive Particles 7)

Conductive particles 7 were prepared by the same method as that for preparing the conductive particles 1, except that the mother particles 7 were used instead of the mother particles 1.

(Conductive Particles 8)

Conductive particles 8 were prepared by the same method as that for preparing the conductive particles 1, except that the mother particles 8 were used instead of the mother particles 1.

(Evaluation of Insulating-Covered Particles)

Example 1

<Preparation of Adhesive Solution>

There were dissolved 100 g of a phenoxy resin (trade name: PKHC by Union Carbide Corp.) and 75 g of acrylic rubber (copolymer comprising 40 parts of butyl acrylate, 30 parts of ethyl acrylate, 30 parts of acrylonitrile, 3 parts of glycidyl methacrylate, molecular weight: 850,000) in 300 g of ethyl acetate to obtain a 30 wt % solution.

After then adding 300 g of a liquid epoxy containing a microcapsule-type latent curing agent (NOVACURE HX-3941, trade name of Asahi Kasei Epoxy Co., Ltd., epoxy equivalents: 185) to the solution, the mixture was stirred to obtain an adhesive solution.

<Ultrasonic Dispersion of Conductive Particles>

A 4 g portion of the previously prepared conductive particles 1 was ultrasonically dispersed in 10 g of ethyl acetate. The conditions for the ultrasonic dispersion were 38 kHz, 400 W, 20 L, and the sample dipped in a beaker was placed in a test apparatus (trade name: US107, Fujimoto Kagaku) and stirred for 1 minute.

The particle dispersion was dispersed in an adhesive solution to 21 vol % of the conductive particles 1 with respect to the adhesive, and the solution was applied onto a separator (silicone treated 40 μm-thick polyethylene terephthalate film) using a roll coater and dried at 90° C. for 10 minutes to prepare a 25 μm-thick anisotropic conductive adhesive film.

The prepared anisotropic conductive adhesive film was then used to prepare a connection structure sample comprising a chip (1.7×17 mm, thickness: 0.5 μm) with gold bumps (area: 30×90 μm, space: 10 μm, height: 15 μm, bump count: 362) and a glass substrate (thickness: 0.7 mm) with an Al circuit, by the following method.

First, the anisotropic conductive adhesive film (2×19 mm) was attached to the glass substrate with the Al circuit at 80° C., 0.98 MPa (10 kgf/cm$^2$), and then the separator was released and the chip bumps were positioned on the glass substrate with the Al circuit. This was then heated and pressed from above the chip under conditions of 190° C., 40 g/bump, 10 seconds for main connection, to obtain a sample.

Example 2

A sample was prepared in the same manner as Example 1, except that conductive particles 2 were used instead of conductive particles 1.

Example 3

A sample was prepared in the same manner as Example 1, except that conductive particles 3 were used instead of conductive particles 1.

Example 4

A sample was prepared in the same manner as Example 1, except that conductive particles 4 were used instead of conductive particles 1.

Example 5

A sample was prepared in the same manner as Example 1, except that conductive particles 5 were used instead of conductive particles 1.

Comparative Example 1

A sample was prepared in the same manner as Example 1, except that conductive particles 6 were used instead of conductive particles 1.

Comparative Example 2

A sample was prepared in the same manner as Example 1, except that conductive particles 7 were used instead of conductive particles 1.

Comparative Example 3

A sample was prepared in the same manner as Example 1, except that conductive particles 8 were used instead of conductive particles 1.

[Measurement of Metal Film Thickness]

For measurement of the film thickness of each nickel plating layer (metal-plated coating film layer) and palladium plating layer, the sample was dissolved in 50 vol % aqua regalis and then the resin was removed by filtration with a membrane filter having a pore diameter of 3 μm (Millipore), and the thickness was calculated after measuring the amount of each metal by atomic absorption (Z5310, product name of Hitachi, Ltd.).

[Observation of Pinholes]

Each of the mother particles was used as an observation sample before silica covering for observation of the palladium plating layer surface. Mother particles 1-8 were sprinkled on conductive tape and the palladium plating layer surface was observed with an SEM (S4700, product name of Hitachi, Ltd.). The acceleration voltage was 5 kV, and 100 arbitrarily selected mother particles were observed at a magnification of 30,000. The observation range of pinholes was within a concentric circle at the particle radius, and the number of particles having 5 or more pinholes per particle was counted.

[Evaluation of Conductive Particles]

A slice necessary for observation and analysis was cut from the obtained conductive particles using a focused ion beam. Component analysis was performed in each range of the plating layer with an EDX by Noran, an accessory of an HF-2200 Transmission Electron Microscope (product name of Hitachi, Ltd.). After measurement of 10 arbitrary conductive particles, the nickel and phosphorus concentrations of each region were calculated from the obtained values.

An ESCA Analyzer, Mode AXIS-165 (product name of Shimadzu Corp./Kratos) may also be used instead of an EDX, for component analysis of each region of the nickel plating layer and palladium plating layer. With ESCA, each mother particle, prior to placement of the insulating fine particles, may be anchored to indium foil and the nickel plating layer and palladium plating layer gradually removed by Ar etching while performing component analysis of the plating layer surface. Measurement can be accomplish relatively easily by this method. In this case, component analysis may be performed each minute during Ar etching, with an Ar etching rate of 5 nm/min, and this may be repeated to calculate the components in each region of the plating layer. Incidentally, the value at the point at which palladium was no longer detected was defined as the outer surface of the nickel plating layer on the palladium plating layer side, and the value at the point at which carbon from the resin fine particles was detected and the nickel signal decreased and converged was defined as the resin fine particle surface, for calculation of the nickel and phosphorus concentrations in each region of the plating layer.

[Child Particle Coverage Factor]

The coverage factor (silica coverage factor) of the child particles (insulating particles) was calculated by taking an electron microscope photograph of each conductive particle and analyzing the image.

[Monodisperse Rate]

The particle size distribution for each of the conductive particles was measured with a flow particle imaging device (FPIA-3000S, product name of Sysmex Corp.). By analysis, the number of particles with only a first peak (highest peak) were selected and the monodisperse rate was calculated from the ratio of the total number of observed particles and the number of first peak particles.

[Insulation Resistance Test and Conduction Resistance Test]

The samples prepared for Examples 1-5 and Comparative Examples 1-3 were subjected to an insulation resistance test (insulating reliability test) and a conduction resistance test. It is important for an anisotropic conductive adhesive film to have high insulation resistance between chip electrodes and low conduction resistance between chip electrodes/glass electrodes.

In the insulating reliability test, the insulation resistance between chip electrodes was measured as the minimum measured value for 20 samples. The insulation resistance is the minimum value from the results before and after a bias test (durability test with 60% humidity, 90° C. and 20 V direct-current voltage). The denotations of 100 hours and 300 hours in Table 1 are the bias test times.

The average value for 14 samples was measured as the conduction resistance between the chip electrode/glass electrode. The conduction resistance was measured as the initial value and the value after moisture absorption resistance heat testing (1000 hours standing under conditions with 85° C. temperature, 85% humidity).

Each of the measurement results are shown in Table 1.

TABLE 1

| | | Example 1 | Example 2 | Example 3 | Example 4 | Example 5 | Comp. Example 1 | Comp. Example 2 | Comp. Example 3 |
|---|---|---|---|---|---|---|---|---|---|
| Nickel plating layer | Phosphorus concentration in region A (wt %) | 15 | 13 | 10 | 8 | 7 | 11 | 13 | 1.7 |
| | Phosphorus concentration in region B (wt %) | 2.0 | 1.1 | 3.0 | 1.5 | 0.5 | 11 | 7 | 1.7 |
| | Film thickness (nm) | 80 | 80 | 70 | 80 | 80 | 80 | 80 | 80 |
| Phosphorus concentration of metal-plated coating film layer (wt %) | | 13 | 10 | 9 | 8 | 7 | 11 | 10 | 1.7 |
| Palladium plating layer | Film thickness (nm) | 20 | 20 | 30 | 20 | 20 | 20 | 20 | 20 |
| | Number of pinholes | 8 | 5 | 6 | 8 | 4 | >50 | >50 | 7 |
| Insulating covering | Silica coverage factor (%) | 50 | 51 | 54 | 50 | 55 | 37 | 41 | 50 |
| Anisotropic conductive film | Monodisperse rate (%) | >90 | >90 | >90 | >90 | >90 | >90 | >90 | <55 |
| | Conduction resistance ($\Omega$) Initial | <20 | <20 | <20 | <20 | <20 | <20 | <20 | <20 |
| | Conduction resistance ($\Omega$) After moisture absorption test | <20 | <20 | <20 | <20 | <20 | >20 | >20 | <20 |
| | Insulating reliability test ($\Omega$) 0 hr | $1.0 \times 10^{10}$ | $1.0 \times 10^{10}$ | $1.0 \times 10^{10}$ | $1.0 \times 10^{10}$ | $1.0 \times 10^{10}$ | $1.0 \times 10^{10}$ | $1.0 \times 10^{10}$ | $<1.0 \times 10^{5}$ |
| | Insulating reliability test ($\Omega$) 100 hr | $1.0 \times 10^{10}$ | $1.0 \times 10^{10}$ | $1.0 \times 10^{10}$ | $1.0 \times 10^{10}$ | $1.0 \times 10^{10}$ | $<1.0 \times 10^{5}$ | $1.0 \times 10^{10}$ | $<1.0 \times 10^{5}$ |
| | Insulating reliability test ($\Omega$) 300 hr | $1.0 \times 10^{10}$ | $1.0 \times 10^{10}$ | $1.0 \times 10^{10}$ | $1.0 \times 10^{10}$ | $1.0 \times 10^{10}$ | $<1.0 \times 10^{5}$ | $<1.0 \times 10^{5}$ | $<1.0 \times 10^{5}$ |
| Overall evaluation | | acceptable | acceptable | acceptable | acceptable | acceptable | rejected | rejected | rejected |

Region A in Table 1 is the region at a distance in the nickel plating layer of no greater than 20% of the total nickel plating layer thickness, from the surface of the resin fine particles (core particles). Region B is the region at a distance in the nickel plating layer of no greater than 10% of the total nickel plating layer thickness, from the palladium layer surface.

The mother particles 1, 6 and 8 were photographed by SEM.

As shown in Table 1, Examples 1-5 and Comparative Example 3, which employed conductive particles having a phosphorus concentration of no greater than 3 wt % on the nickel plating layer outer surface side, had virtually no pinholes in the palladium plating layer surface and exhibited a dense, continuous palladium plating layer. A dense, continuous palladium plating layer was confirmed in the SEM photograph of the mother particles 1 used in Example 1 and the SEM photograph of the mother particles 8 used in Comparative Example 3. Since low-phosphorus nickel undergoes uniform dissolution of the nickel in the nickel surface during palladium plating, and the palladium substitution reaction tends to take place uniformly, the palladium plating layer formed by the subsequent reduction reaction is dense and uniform, and therefore Examples 1-5 and Comparative Example 3 yielded dense, continuous palladium plating layers with virtually no pinholes. With such conductive particles having few pinholes the underlying nickel does not easily exude into the palladium surface, and corrosion and elution of the underlying nickel is thus inhibited, resulting in the high insulating reliability shown in Table 1. The mother particles 8 of Comparative Example 3, however, had a low monodisperse ratio despite having few pinholes. This is due to magnetic aggregation by the magnetization of the particles, because of the low phosphorus concentration of the metal-plated coating film layer (nickel plating layer). The conductive particles of Comparative Example 3, as a ferromagnetic material, had a low monodisperse rate in the anisotropic conductive film and relatively small distance between particles, and therefore exhibited a poor insulating property. Actual optical microscope observation of the glass surface of the sample of Comparative Example 3 near the electrode showed aggregated particles.

By the SEM photograph of the conductive particles 6 shown in Comparative Example 1, it is confirmed that the palladium plating layer of the conductive particles 6 was non-uniform and non-dense, and that the underlying nickel was exposed. In Comparative Example 1, the phosphorus concentration of the underlying nickel was high, the magnetism of the particles was low, which prevented magnetic aggregation, and the monodisperse rate was satisfactory, but the tendency toward nickel corrosion and elution resulted in inferior insulating reliability. Comparative Example 2 had a lower nickel surface phosphorus concentration than Comparative Example 1, and tended to have fewer pinholes in the palladium plating layer, but incomplete coating with the palladium plating layer resulted in poor insulating reliability. It is therefore preferable for the phosphorus concentration of the nickel surface to be no greater than 3 wt % to ensure coating of the nickel surface with a dense palladium plating layer. Also, the phosphorus concentration on the core particle side is preferably high, and especially 7 wt % or greater, to prevent aggregation by magnetism.

Examples 1-5 prepared according to the invention and Comparative Example 3 had high surface Pd contents, and therefore chemisorption of thiol readily occurred on the particle surfaces. Thus, virtually no desorption of the child particles (silica) occurred before and after ultrasonic dispersion. As regards insulation resistance during the molding test of the child particles (silica) as well, the samples prepared according to the invention (Examples 1-5) were resistant to desorption of the child particles, such that a satisfactory yield was obtained. Comparative Example 3 had magnetic aggregation as mentioned above, and therefore exhibited inferior insulating reliability.

The samples prepared in Comparative Examples 1 and 2, on the other hand, had non-uniform palladium plating layers and non-dense films, and therefore a high proportion of nickel was exposed on the surface. The particle surfaces were therefore resistant to chemisorption of thiol, the bonding strength between the silica and mother particles was weak, and the silica tended to be desorbed from the mother particles during ultrasonic dispersion. As regards the insulation resistance in the mounting test as well, more insulating defects were also exhibited by the samples prepared in Comparative Examples 1 and 2.

(Evaluation of Particles without Insulating Covering)

Example 6

A sample was prepared in the same manner as Example 1, except that 2 g of mother particles 2 were used instead of 4 g of conductive particles 1.

Comparative Example 4

A sample was prepared in the same manner as Example 1, except that 2 g of mother particles 6 were used instead of 4 g of conductive particles 1.

Measurement of the metal film thickness, observation of pinholes, evaluation of the conductive particles, measurement of the monodisperse rate, the insulation resistance test and the conduction resistance test were carried out by the same methods described above.

Each of the measurement results are shown in Table 2.

TABLE 2

| | | Example 6 | Comp. Example 4 |
|---|---|---|---|
| Nickel plating layer | Phosphorus concentration in region A (wt %) | 13 | 11 |
| | Phosphorus concentration in region B (wt %) | 1.1 | 11 |
| | Film thickness (nm) | 80 | 80 |
| Phosphorus concentration of metal-plated coating film layer (wt %) | | 10 | 11 |
| Palladium plating layer | Film thickness (nm) | 20 | 20 |
| | Number of pinholes | 5 | >50 |
| Insulating covering | Silica coverage factor (%) | 0 | 0 |
| Anisotropic conductive film | Monodisperse rate (%) | >90 | >90 |
| | Conduction resistance ($\Omega$) Initial | <20 | <20 |
| | After moisture absorption test | <20 | >20 |
| | Insulating reliability test ($\Omega$) 0 hr | $1.0 \times 10^{10}$ | $1.0 \times 10^{10}$ |
| | 100 hr | $1.0 \times 10^{10}$ | $<1.0 \times 10^{5}$ |
| | 300 hr | $1.0 \times 10^{10}$ | $<1.0 \times 10^{5}$ |
| Overall evaluation | | acceptable | rejected |

As seen in Table 2, the conduction resistance was low in Example 6 which employed the mother particles 2, and the insulating reliability was also satisfactory. This was due to the density of the particle surfaces, as explained above. That is, the number of pinholes can be drastically reduced with conductive fine particles that have intentionally modified phosphorus concentration in the nickel plating layer, allowing the properties of highly conductive palladium to be exhibited. Regarding insulating reliability as well, migration is inhibited presumably because of the dense palladium plating layer. In Comparative Example 4, the high phosphorus concentration in the nickel plating layer resulted in more pinholes in the palladium plating layer, high conduction resistance, increased migration and a greater tendency for insulating defects.

[Industrial Applicability]

As explained above, the present invention can provide conductive fine particles with a satisfactory monodisperse property, low cost, resistance to migration and excellent conductivity, as well as a method for preparing the conductive fine particles and an anisotropic conductive material formed using the conductive fine particles.

[Explanation Of Symbols]

100: Conductive fine particle, 102: core particle, 104: metal-plated coating film layer, 106: conductive layer (palladium layer), 108: insulating fine particles, A: region A, B: region B.

What is claimed is:

1. A conductive fine particle comprising:
   a core particle,
   a metal-plated coating film layer containing nickel and phosphorus formed on the surface of the core particle, and
   a palladium layer formed on the surface of the metal-plated coating film layer facing away from the core particle, wherein
   the phosphorus content of the metal-plated coating film layer, in region A at distance from the surface of the metal-plated coating film layer on the core particle side of no greater than 20% of a thickness of the entire metal plated coating film layer, is 7-15 wt% with respect to the entire region A,
   the phosphorus content of the metal-plated coating film layer, in region B at a distance from the surface of the metal- plated coating film layer on the palladium layer side of no greater than 10% of the thickness of the entire metal-plated coating film layer, is 0.1-3 wt % with respect to the entire region B,
   the phosphorus content is 7 wt % or greater with respect to the entire metal-plated coating film layer.

2. The conductive fine particle according to claim 1, comprising insulating fine particles situated on the surface of the palladium layer and the insulating fine particles having a particle size of 20-500 nm.

3. The conductive fine particle according to claim 1, wherein:
   the palladium layer is dense and continuous with no exposure of the underlying nickel, and
   a surface of the palladium layer of no more than 10 of 100 arbitrarily selected particles of the conductive fine particles observed using SEM (Scanning Electron Microscope), with an observation range of a concentric circle of a conductive fine particle radius, and an observation magnification of 30,000, has 5 or more pinholes on the surface of the palladium layer.

4. The conductive fine particle according to claim 1, wherein the thickness of the metal-plated coating film layer is 40-150 nm.

5. The conductive fine particle according to claim 1, wherein at least a part of the palladium layer is a palladium layer formed by reduction plating.

6. The conductive fine particle according to claim 1, wherein the thickness of the palladium layer is 10-50 nm.

7. The conductive fine particle according to claim 1, wherein the metal-plated coating film layer containing nickel and phosphorus is a nickel plating layer containing phosphorus.

8. The conductive fine particle according to claim 1, wherein the metal-plated coating film layer containing nickel and phosphorus is a metal-plated coating film layer consisting of nickel and phosphorus.

9. The conductive fine particle according to claim 1, wherein only two layers of the metal-plated coating film layer and the palladium layer are formed on the surface of the core particle.

10. The conductive fine particle according to claim 1, wherein the phosphorus content is 8 wt % or greater with respect to the entire metal-plated coating film layer.

11. An anisotropic conductive material comprising conductive fine particles according to claim 1 dispersed in a binder resin.

12. The anisotropic conductive material according to claim 11, wherein:
   in each of the conductive fine particles, the palladium layer is dense and continuous with no exposure of the underlying nickel, and wherein:
   in each 100 arbitrarily selected conductive fine particles observed using an SEM (Scanning Electron Microscope), with an observation range of a concentric circle of a conductive fine particle radius, and an observation magnification of 30,000, no more than 10 of the conductive fine particles have 5 or more pinholes on the surface of the palladium layer.

* * * * *